United States Patent
Huang et al.

(10) Patent No.: US 7,795,131 B2
(45) Date of Patent: Sep. 14, 2010

(54) METHOD OF FABRICATING METAL INTERCONNECTS AND INTER-METAL DIELECTRIC LAYER THEREOF

(75) Inventors: Kuan-Jui Huang, Kao-Hsiung Hsien (TW); Jie-Mei Huang, Taipei County (TW); Chung-Hsiang Wang, Taoyuan County (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 676 days.

(21) Appl. No.: 11/684,646

(22) Filed: Mar. 12, 2007

(65) Prior Publication Data

US 2008/0146021 A1 Jun. 19, 2008

(30) Foreign Application Priority Data

Dec. 15, 2006 (TW) ................. 95147104 A

(51) Int. Cl.
*H01L 21/4763* (2006.01)

(52) U.S. Cl. ................. 438/622; 438/624; 438/625; 438/626

(58) Field of Classification Search .......... 438/622–626
See application file for complete search history.

(56) References Cited

U.S. PATENT DOCUMENTS

| | | | |
|---|---|---|---|
| 6,174,810 B1 | 1/2001 | Islam | |
| 6,501,180 B1 * | 12/2002 | Kitch | 257/762 |
| 6,867,125 B2 * | 3/2005 | Kloster et al. | 438/618 |
| 7,425,501 B2 * | 9/2008 | Gotkis et al. | 438/622 |
| 2003/0087513 A1 * | 5/2003 | Noguchi et al. | 438/627 |
| 2006/0035457 A1 * | 2/2006 | Carter et al. | 438/624 |
| 2006/0043596 A1 * | 3/2006 | Gotkis et al. | 257/758 |
| 2006/0183312 A1 | 8/2006 | Hu | |
| 2007/0052101 A1 | 3/2007 | Usami | |
| 2007/0114668 A1 * | 5/2007 | Goto et al. | 257/758 |

FOREIGN PATENT DOCUMENTS

| | | |
|---|---|---|
| CN | 1232291 A | 10/1999 |
| CN | 1825544 A | 8/2006 |
| CN | 1825545 A | 8/2006 |
| CN | 1832132 A | 9/2006 |
| TW | 531841 | 5/2003 |

\* cited by examiner

*Primary Examiner*—Matthew C Landau
*Assistant Examiner*—James M Mitchell
(74) *Attorney, Agent, or Firm*—Winston Hsu

(57) ABSTRACT

A method of fabricating metal interconnects and an inter-metal dielectric layer thereof. A first metal interconnect pattern and a second metal interconnect pattern disposed thereon are formed on a substrate by plating processes. Subsequently, an inter-metal dielectric layer is formed on the substrate, the first metal interconnect pattern and the second metal interconnect pattern. The inter-metal dielectric layer is then planarized and the second metal interconnect pattern is exposed.

16 Claims, 6 Drawing Sheets

METHOD OF FABRICATING METAL INTERCONNECTS AND INTER-METAL DIELECTRIC LAYER THEREOF

BACKGROUND OF THE INVENTION

1. Field of the Invention

The present invention relates to a method of fabricating metal interconnects and inter-metal dielectric layer thereof, and more particularly, to a method of fabricating a thick metal interconnect layer with reduced resistance, and a method of fabricating a thick inter-metal dielectric layer.

2. Description of the Prior Art

Metal interconnects, which are disposed over electronic devices, are responsible for transmitting signals sending from electronic devices and for transmitting external signals to electronic devices, and therefore the resistance of metal interconnects is critical to the transmission speed. A high resistance of metal interconnects will reduce the transmission speed, thereby degrading the response time and increasing power consumption of electronic products.

According to basic electronics theorem, the resistance of a conducting wire is inversely proportional to its cross-sectional area. Therefore, the thicker the metal interconnect is, the lower the resistance is. Conventionally, the metal interconnects are multilevel interconnects fabricated by a copper damascene process. A copper damascene process includes the following steps. First, an inter-metal dielectric layer is formed, and trenches are formed in the inter-metal dielectric layer. Subsequently, a copper metal layer is formed on the inter-metal dielectric layer, filling the trenches. Thereafter, a CMP process is performed to remove the copper metal layer outside the trenches. The above steps are repeated to form multilevel copper interconnects. Since each copper metal interconnect layer requires one CMP process, the cost is increased and the yield may be affected. In addition, there are two methods to fabricate inter-metal dielectric layer: one method forms BPSG glass on the wafer first, and planarizes BPSG glass by thermal reflow to form a silicon oxide layer; the other method uses SOG process to coat dielectric material dissolved in a solvent on the wafer, and removes the solvent by thermal treatment to form a silicon oxide layer. However, the dielectric constant of the inter-metal dielectric layer formed by the conventional methods is not able to meet the electrical requirements of some types of electronic devices e.g. high frequency devices or MEMS devices.

SUMMARY OF THE INVENTION

It is therefore one objective of the present invention to provide a method of fabricating metal interconnects to simplify metal interconnect fabrication.

It is another objective of the present invention to provide a method of inter-metal dielectric layer to increase the thickness limitation of inter-metal dielectric layer and to improve its applications.

According to the claimed invention, a method of fabricating metal interconnects is provided. The method includes:

providing a substrate;

forming a first sacrificial pattern on the substrate, the first sacrificial pattern comprising a plurality of first openings;

forming a first plating process to form a first metal interconnect pattern in each of the openings;

removing the first sacrificial pattern, and forming a second sacrificial pattern on the substrate and on the first metal interconnect pattern, the second sacrificial pattern comprising a plurality of second openings partially exposing the first metal interconnect pattern;

performing a second plating process to form a second metal interconnect in each of the second openings;

removing the second sacrificial pattern;

forming an inter-metal dielectric layer on the substrate, the first metal interconnect pattern and the second metal interconnect pattern; and planarizing the surface of the inter-metal dielectric layer to expose the second metal interconnect pattern.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
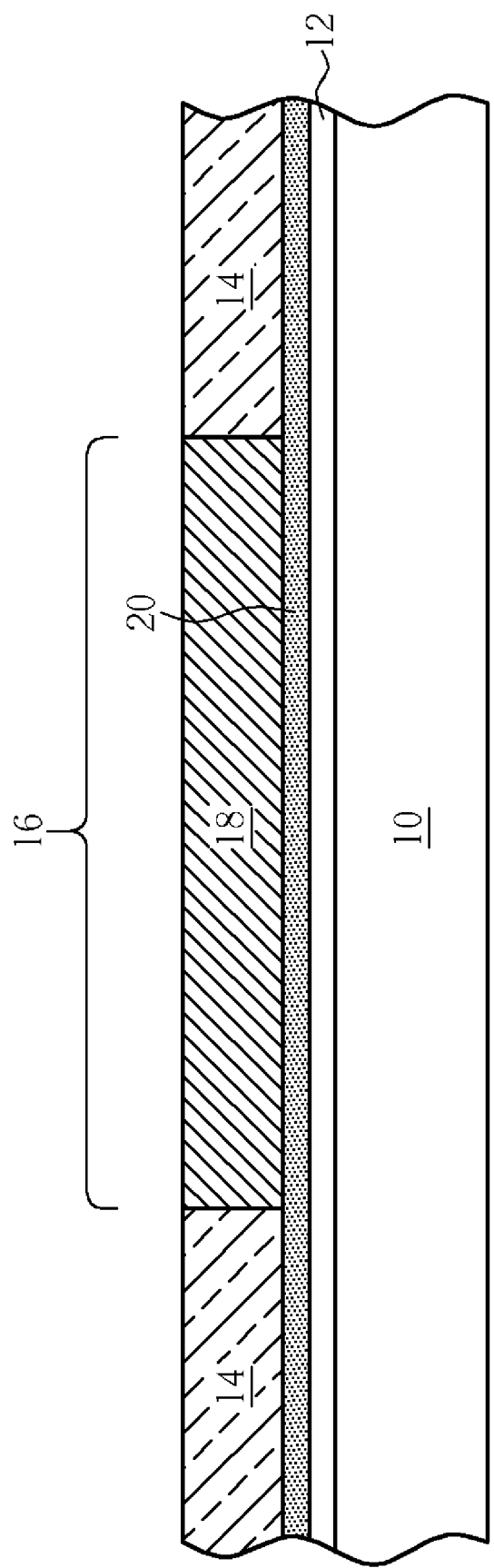
FIGS. 1-6 are schematic diagrams illustrating a method of fabricating metal interconnects and inter-metal dielectric layer according to a preferred embodiment of the present invention.

Please refer to FIGS. 1-6. FIGS. 1-6 are schematic diagrams illustrating a method of fabricating metal interconnects and inter-metal dielectric layer according to a preferred embodiment of the present invention. As shown in FIG. 1, a substrate 10 e.g. a semiconductor wafer including a silicon wafer or an SOI wafer is provided. The substrate 10 may includes electronic devices (not shown) disposed thereon. Subsequently, a thermal oxide layer 12, which serves as a stress buffer layer and a diffusion barrier layer, is formed on the substrate 10. It is appreciated that the thermal oxide layer 12 may not be required in other embodiments. Then, a seed layer 20 is formed on the thermal oxide layer 12. The seed layer 20, which may be formed by sputter or other deposition techniques, can be a TiW/Cu thin film, a Cr/Au thin film, a Ti/Au thin film, etc.

Following that, a first sacrificial layer 14 e.g. a photoresist pattern, which includes a plurality of first openings 16 is formed on the surface of the seed layer 20. Subsequently, a first plating process is performed to form a first metal interconnect pattern 18 in each of the first openings 16. In the instant embodiment, an electroplating or a non-electroplating process is used to form a copper metal layer as the material of the first metal interconnect pattern 18, and the thickness of the first metal interconnect pattern 18 is approximately between 4 and 6 micrometers. It is to be noted that the material of the first metal interconnect pattern 18 is not limited to copper, and the thickness is not limited to the aforementioned range. In addition, the process parameters e.g. process time should be controlled so as to ensure that the thickness of the first metal interconnect pattern 18 does not exceed that of the first sacrificial pattern 14.

Figure 2:
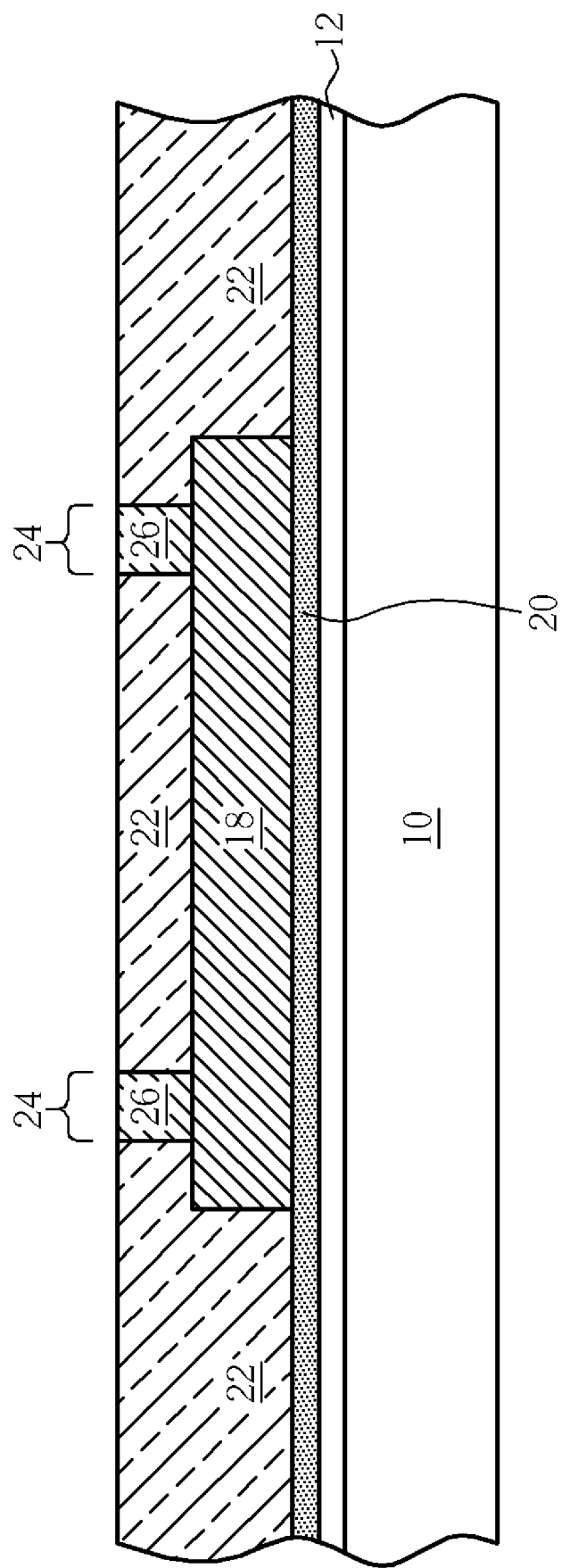

As shown in FIG. 2, first sacrificial pattern 14 is removed, and a second sacrificial pattern 22 e.g. a photoresist pattern is formed on the thermal oxide layer 12 and the first metal interconnect pattern 18. The second sacrificial pattern 22 includes a plurality of second openings 24 partially exposing the first metal interconnect pattern 18. Subsequently, a second plating process is carried out to form a second metal interconnect pattern 26 in each of the second openings 24. In this embodiment, the second metal interconnect pattern 26 is a plug layer, and the second plating process is an electroplating or a non-electroplating process that forms a copper metal layer on the first metal interconnect pattern 18. In addition, the thickness of the second metal interconnect pattern 26 is approximately between 4 and 6 micrometers. However, the material of the second metal interconnect pattern 26 is not limited to copper, and the thickness is not limited to the aforementioned range.

Figure 3:
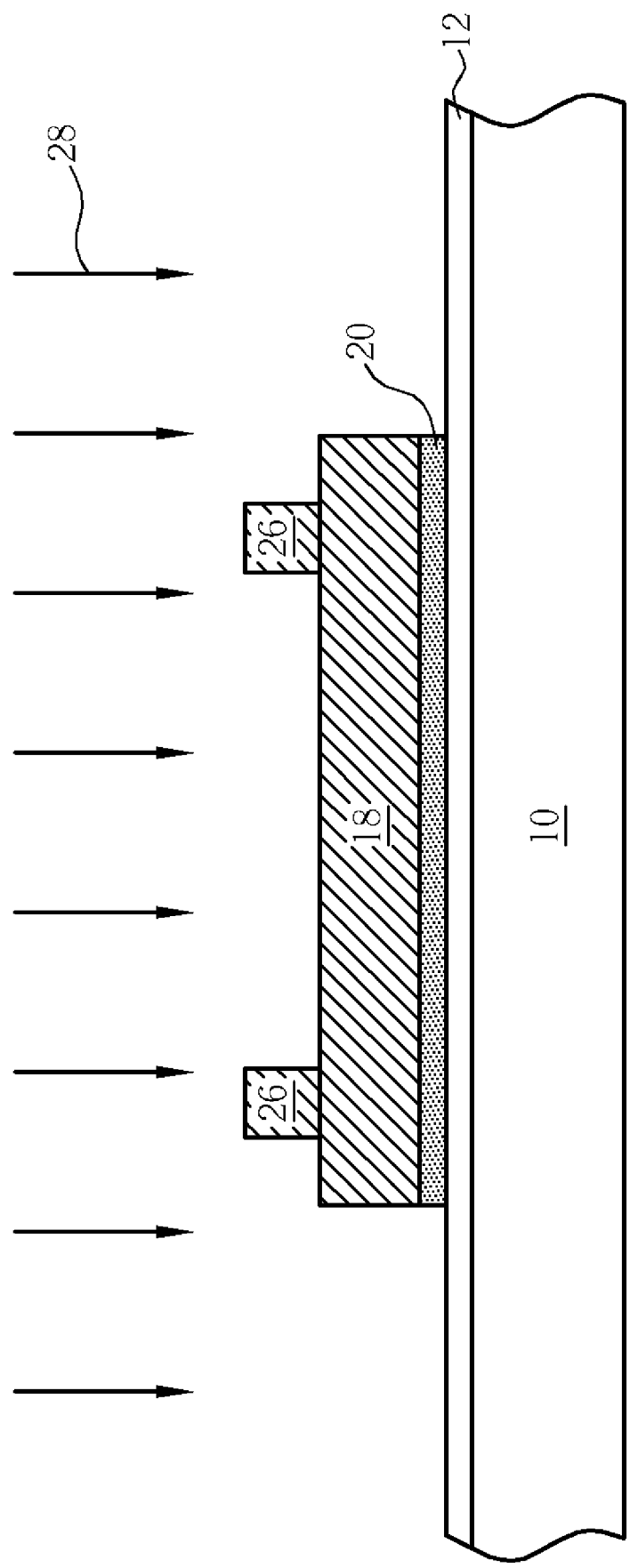

As shown in FIG. 3, the second sacrificial pattern 22, and the seed layer 20 not covered by the first metal interconnect pattern 18 are removed to form the metal interconnect. In this embodiment, the total thickness of the first metal interconnect pattern 18 and the second metal interconnect pattern 26 may reach 8 to 12 micrometers or thicker, therefore the thickness of the inter-metal dielectric layer to be formed has to be thicker than that of the metal interconnect. For instance, the thickness of the inter-metal dielectric layer has to be more than 12 micrometers. Under such a condition, the method of the present invention includes performing a surface treatment 28 upon the first metal interconnect pattern 18 and the second metal interconnect pattern 26 to reduce the stress of the inter-metal dielectric layer to be formed and to ensure a better adhesion.

The surface treatment 28 of the present embodiment includes the following steps:

1. Perform a wet cleaning process by using a cleaning solution e.g. citric acid to dip or rinse the substrate 10. The wet cleaning process aims to remove metal oxide e.g. copper oxide remaining on the surface of the first metal interconnect pattern 18 and the second metal interconnect pattern 26.

2. Perform a plasma pre-cleaning process to remove organic compound remaining on the surface of the first metal interconnect pattern 18 and the second metal interconnect pattern 26 by plasma.

3. Perform a plasma pre-etching process to increase the purity and surface roughness of the substrate 10, the first metal interconnect pattern 18 and the second metal interconnect pattern 26 by plasma bombardment.

It is to be appreciated that the step sequence of the surface treatment 28 is not limited by the aforementioned order. Depending on the purity condition of the substrate 10, the first metal interconnect pattern 18 and the second metal interconnect pattern 26, some steps may be omitted or repeated, or other cleaning or etching process (wet or dry types) may be incorporated to improve the purity and surface roughness of the substrate 10, the first metal interconnect pattern 18 and the second metal interconnect pattern 26.

Figure 4:
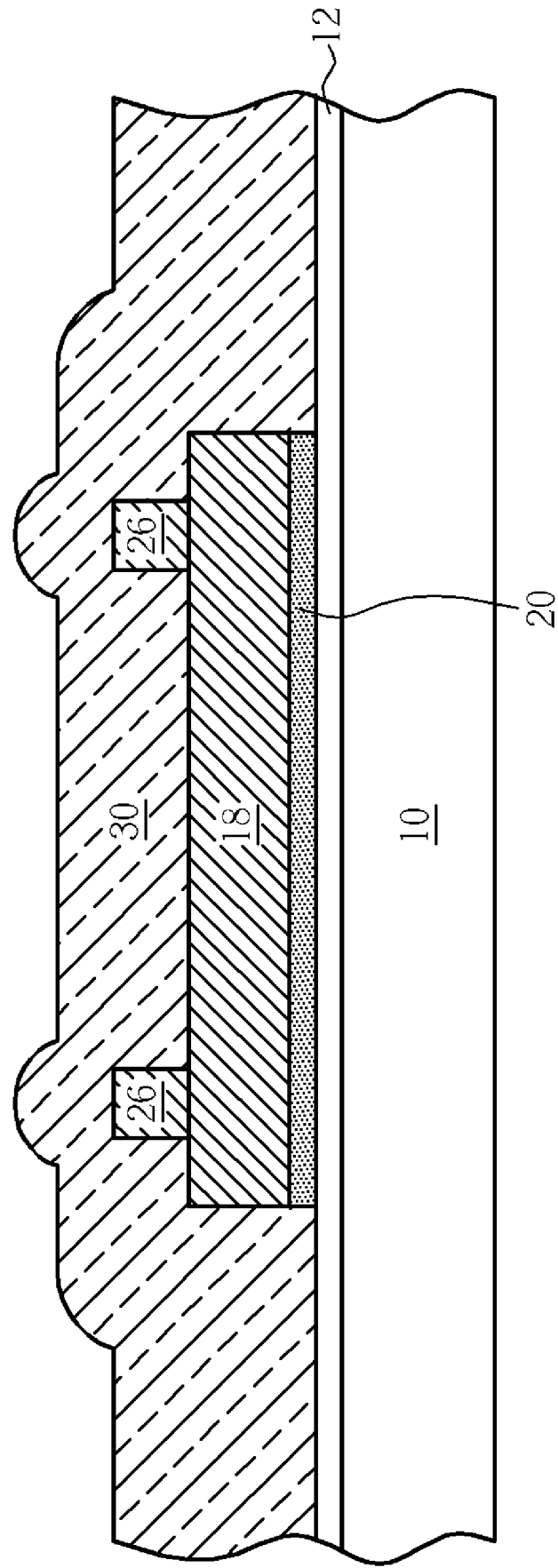

As shown in FIG. 4, an inter-metal dielectric layer 30 is formed on the first metal interconnect pattern 18, the second metal interconnect pattern 26 and the thermal oxide layer 12. In this embodiment, the inter-metal dielectric layer 30 is a silicon oxide layer, and formed by a PECVD process. As mentioned earlier, the thickness of the inter-metal dielectric layer 30 has to be thicker than 12 micrometers in this embodiment, and thus the PECVD process of this embodiment is implemented by alternately using plasma of different frequencies. For instance, high frequency plasma and low frequency plasma are alternately used to deposit the inter-metal dielectric layer 30. This method is able to reduce the stress of the inter-metal dielectric layer 30. In addition, the PECVD process can also be carried out in a multi-staged manner so as to prevent occurrence of void or crack in the inter-metal dielectric layer 30.

Figure 5:
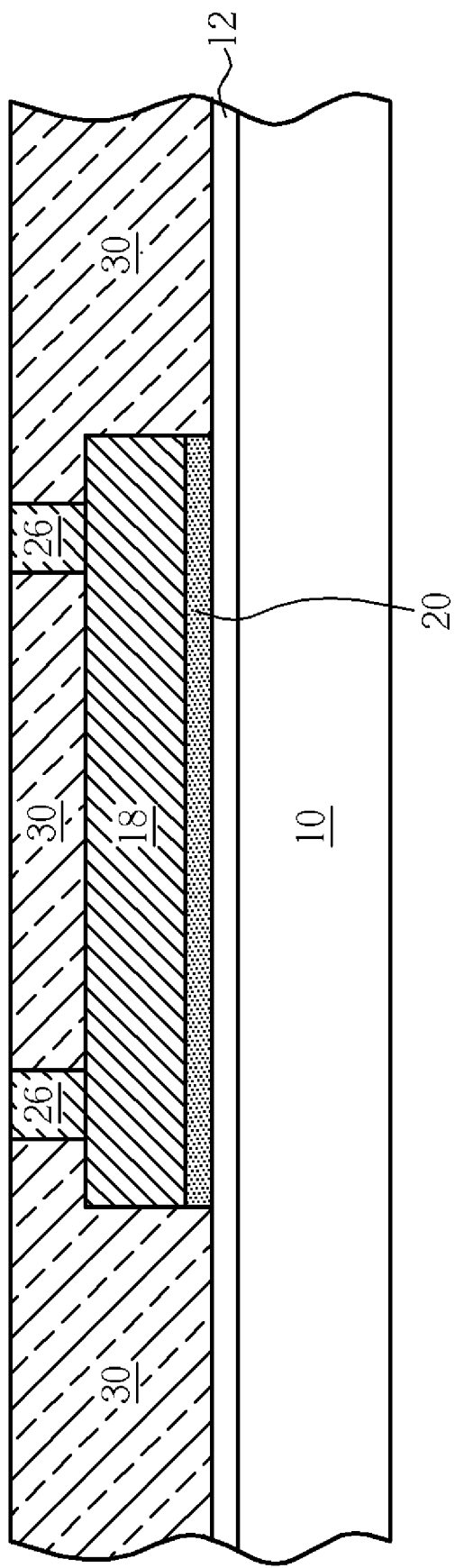

As shown in FIG. 5, the surface of the inter-metal dielectric layer 30 is planarized to expose the second metal interconnect pattern 26. In the present embodiment, the planarization is carried out by a CMP process, but not limited to. The planarization can also be done by etching or other techniques.

Figure 6:
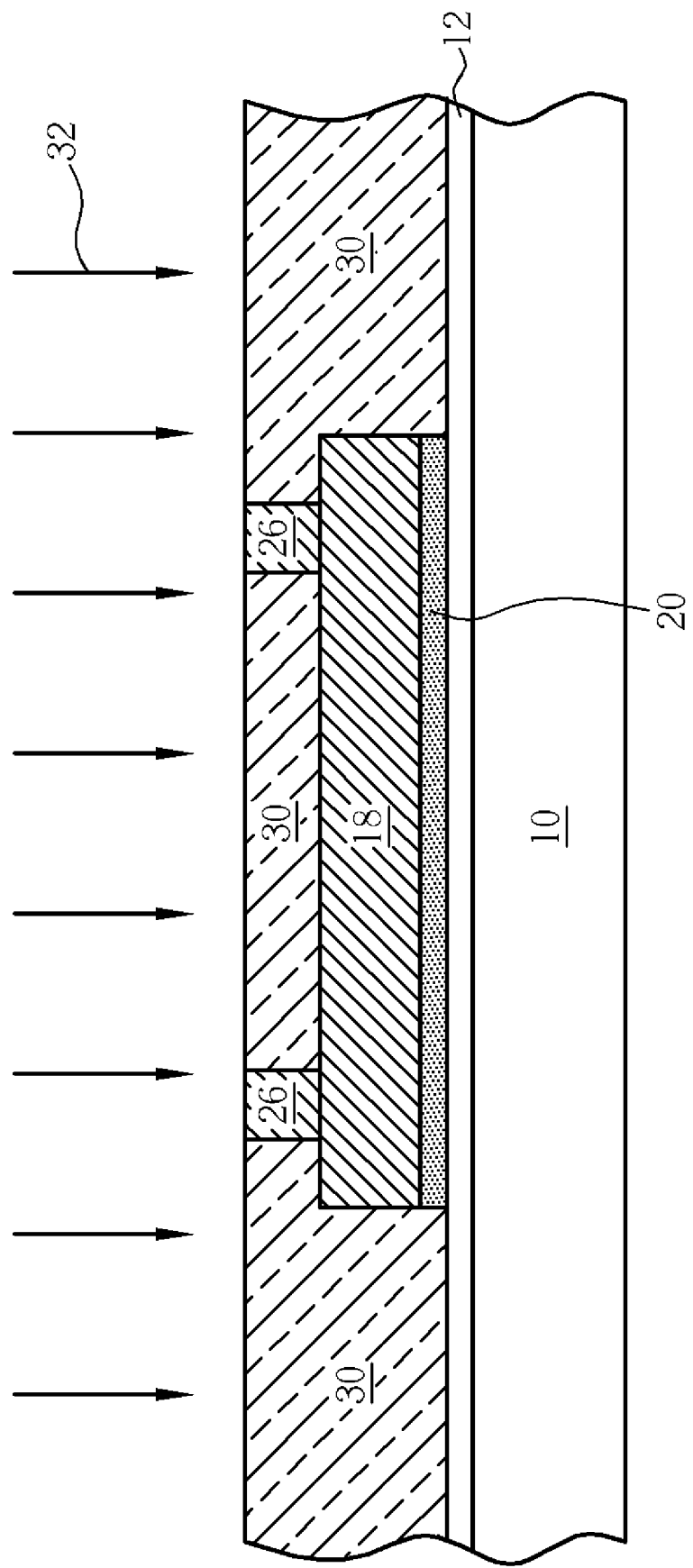

As shown in FIG. 6, another surface treatment 32 is performed to remove oxides and organic compounds remaining on the surface of the second metal interconnect pattern 26 and the inter-metal dielectric layer 30, and also to increase the purity and surface roughness of the second metal interconnect pattern 26 and the inter-metal dielectric layer 30. The surface treatment 32 can be the same as the steps of the surface treatment 28, or be modified wherever necessary.

In conclusion, the method of the present invention is beneficial for the following reasons. First, the method of the present invention uses electroplating or non-electroplating process to fabricate the metal interconnect, thereby increasing the thickness of the metal interconnect and reducing the resistance. Second, the present method requires only one CMP process to form a two-layered metal interconnect, while the conventional method requires two CMP processes. In addition, the high frequency/low frequency or multi-staged PECVD method is able to fabricate an inter-metal dielectric layer that can meet different isolation requirements, and improve the coverage of the inter-metal dielectric layer.

It is to be noted that the method of the present invention is not limited to fabricate a two-layered metal interconnect. More metal interconnect layers can be fabricated over the second metal interconnect pattern by the method of the present invention where necessary.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating metal interconnects, comprising:

providing a substrate;

forming a first sacrificial pattern on the substrate, the first sacrificial pattern comprising a plurality of first openings;

forming a first plating process to form a first metal interconnect pattern in each of the openings;

removing the first sacrificial pattern, and forming a second sacrificial pattern on the substrate and on the first metal interconnect pattern, the second sacrificial pattern comprising a plurality of second openings partially exposing the first metal interconnect pattern;

performing a second plating process to form a second metal interconnect in each of the second openings;

removing the second sacrificial pattern, wherein a lateral surface of the first metal interconnect pattern and a lateral surface of the second metal interconnect are exposed after the second sacrificial pattern is removed;

forming an inter-metal dielectric layer on the substrate, the first metal interconnect pattern and the second metal interconnect pattern when the lateral surface of the first metal interconnect pattern and the lateral surface of the second metal interconnect pattern are exposed, wherein the inter-metal dielectric layer covers the exposed lateral surface of the first metal interconnect pattern and the exposed lateral surface of the second metal interconnect pattern; and planarizing the surface of the inter-metal dielectric layer to expose the second metal interconnect pattern.

2. The method of claim 1, further comprising forming a thermal oxide layer on the substrate prior to forming the first sacrificial pattern on the substrate.

3. The method of claim 1, wherein the material of the first metal interconnect pattern and the second metal interconnect pattern comprises copper.

4. The method of claim 1, wherein the first plating process comprises an electroplating process or a non-electroplating process.

5. The method of claim 1, wherein the second plating process comprises an electroplating process or a non-electroplating process.

6. The method of claim 1, further comprising forming a seed layer on the substrate prior to performing the first plating process.

7. The method of claim 1, further comprising performing a surface treatment on the first metal interconnect pattern and the second metal interconnect pattern prior to forming the inter-metal dielectric layer.

8. The method of claim 7, wherein the surface treatment comprises performing a wet cleaning process to remove metal oxides disposed on the surface of the first metal interconnect pattern and the second metal interconnect pattern.

9. The method of claim 7, wherein the surface treatment comprises performing a plasma pre-cleaning process to remove organic compounds disposed on the surface of the first metal interconnect pattern and the second metal interconnect pattern.

10. The method of claim 7, further comprising performing a plasma pre-etching process to increase the surface roughness and purity of the first metal interconnect pattern and the second metal interconnect pattern.

11. The method of claim 1, wherein the inter-metal dielectric layer comprises a silicon oxide layer.

12. The method of claim 1, wherein the inter-metal dielectric layer is formed by a plasma enhanced chemical vapor deposition (PECVD) process.

13. The method of claim 12, wherein the PECVD process is implemented by alternately using high frequency plasma and low frequency plasma.

14. The method of claim 1, wherein the step of planarizing the surface of the inter-metal dielectric layer to expose the second metal interconnect pattern is implemented by a chemical mechanical polishing (CMP) process.

15. The method of claim 1, further comprising performing a surface treatment on the surface of the inter-metal dielectric layer and the exposed second metal interconnect pattern subsequent to planarizing the surface of the inter-metal dielectric layer.

16. The method of claim 1, wherein the substrate is a semiconductor wafer.

* * * * *